United States Patent [19]

Schettler et al.

[11] Patent Number: 4,551,789
[45] Date of Patent: Nov. 5, 1985

[54] MULTILAYER CERAMIC SUBSTRATES WITH SEVERAL METALLIZATION PLANES

[75] Inventors: Helmut Schettler, Dettenhausen; Ewald Stadler, Herrenberg-Kuppingen, both of Fed. Rep. of Germany

[73] Assignee: International Business Machines Corporation, Armonk, N.Y.

[21] Appl. No.: 449,095

[22] Filed: Dec. 13, 1982

[30] Foreign Application Priority Data

Dec. 23, 1981 [EP] European Pat. Off. ........ 81110713.5

[51] Int. Cl.[4] .............................................. H05K 1/18
[52] U.S. Cl. ..................................... 361/406; 174/36; 174/68.5; 361/409
[58] Field of Search ................. 174/68.5, 36; 361/406, 361/409, 414

[56] References Cited

U.S. PATENT DOCUMENTS

| | | | |
|---|---|---|---|
| 2,963,535 | 12/1960 | Wegener et al. | 174/68.5 X |
| 3,022,480 | 2/1962 | Tiffany | 174/68.5 |
| 3,546,539 | 5/1968 | Wilcox, Jr. | 361/406 X |
| 3,564,115 | 2/1971 | Gribble et al. | 174/68.5 |
| 3,621,116 | 11/1971 | Adams | 174/68.5 |
| 3,818,117 | 6/1974 | Reyner et al. | 174/36 |
| 3,902,790 | 9/1975 | Hsieh et al. | 174/68.5 X |
| 3,914,531 | 10/1975 | Zell et al. | 174/36 |
| 3,939,381 | 2/1976 | Meany | 174/68.5 X |
| 4,353,040 | 10/1982 | Krumm et al. | 333/1 |

FOREIGN PATENT DOCUMENTS

| | | | |
|---|---|---|---|
| 2345572 | 3/1975 | Fed. Rep. of Germany | 174/68.5 |
| 469424 | 4/1969 | Switzerland | 174/68.5 |
| 1157268 | 7/1969 | United Kingdom | 174/68.5 |

OTHER PUBLICATIONS

Jarvela et al., Wirability Enhancement, IBM Tech. Disc. Bull., vol. 21, #9, Feb. 1979, p. 3624.
I. Buckminister, Self-Lugged Stamped Wiring, IBM Tech. Disc. Bull., vol. 1, #5, Feb. 1959, p. 23.
S. Picard, Printed-Circuit Card Rework Process, IBM Tech. Disc. Bull., vol. 15, #1, Jun. 1972, pp. 246 & 247.
M. Grossman, "Multi-Layered Ceramic Packages Multiply Circuit Densities 40 Times," Jan. 1980, vol. 28, *Electronic Design*, pp. 39-40.

Primary Examiner—R. R. Kucia
Attorney, Agent, or Firm—Wolmar J. Stoffel

[57] ABSTRACT

This invention concerns a ceramic substrate for mounting semiconductor integrated circuits. The substrates include at least a first and second patterned metallization layer which respectively form conducting planes that are parallel to each other but separated by a thickness of insulation. The pattern metallization of at least the first plane includes signal conductors for joining the contacts of the integrated circuit chip to pins provided in the substrate for connecting the substrate and chip to a circuit board. In accordance with the invention, the metallization of the second plane includes shorted conductor loops that follow the contour of the signal conductors. The shorted loops of the second plane metallization includes branches which extend parallel to both lateral sides of a respective signal conductor. In accordance with the invention, the branches of the loops are joined at their ends.

4 Claims, 3 Drawing Figures

MULTILAYER CERAMIC SUBSTRATES WITH SEVERAL METALLIZATION PLANES

DESCRIPTION

FIELD OF INVENTION

This invention relates generally to ceramic substrates for mounting semiconductor integrated circuits. More particularly, the invention concerns a ceramic substrate upon which at least two patterned metallization layers are provided in planes separated by a thin insulating layer and wherein the conducting layer in at least one plane includes conductors for connecting the integrated circuit to lead pins in the substrate and the other plane includes patterned metallization for reducing spurious circuit coupling of conductors within and between planes.

BACKGROUND

Because of the continuously increasing number of devices and circuits fabricated in an integrated circuit chip, there has been an ever increasing demand placed on the substrate for mounting such chips. Particularly, in a ceramic substrate having on its mounting surface at least two patterned metallization layers separated by a layer of insulating material, wherein one metallization layer including signal conductors for connecting the chip to the substrate lead pins and the other reference voltage conductors, more and more problems arise with the signal conductors. As a result of the close proximity of the signal conductors required to accommodate the high integration density of the circuit chips, inductive coupling can arise between them. Additionally, as a result of the thin insulating layer used to separate the planes, capacitive coupling can arise between the signal conductors of one plane and the reference voltage conductors of the other plane. These inductive and capacitive coupling effects can result in the spurious circuit performance which can render the chip and substrate combination commercially unacceptable.

The reasons for these problems becomes more apparent when the dimensions for a mounting substrate of the type described are considered. For example, substrate signal conductors typically have a width of 0.1 mm or less. Additionally, the spacing between signal conductors is typically between 2.5 and 0.1 mm or less. Further, the thickness of the insulating layer is typically 1 to 2 $\mu$m. With such dimensioning, the effects of inductive coupling between signal conductors and capacitive coupling of the signal conductors and the reference plane metallization are no longer negligible. As would be apparent to those skilled in the art, such potential for parasitic circuits if left unchecked could adversely affect the performance of the mounted chip.

SUMMARY OF THE INVENTION

It is therefore an objective of this invention to provide a substrate for mounting integrated circuit chips which substantially reduces or eliminates inductive coupling between signal conductors and additionally substantially reduces or eliminates capacitive coupling between the signal conductors and the reference voltage plane conductors.

Briefly, the invention concerns a ceramic integrated circuit mounting substrate of the type noted wherein a first patterned layer of metallization is provided in a first plane and a second patterned layer of metallization in a second plane. In accordance with the invention, the second patterned layer of metallization includes shorted conducting loops which conform to the contours of the patterned conductors in the first plane. The loops are arranged such that they comprise branches which extend laterally on either side of the conductors in the first plane. Additionally, in accordance with this invention, the loop branches provided for the conductors of the first plane have their ends connected to close the loops.

In general, the invention can comprise a plurality of signal planes wherein a reference voltage plane containing the shorted loops is arranged in conformity with the signal conductors and located between successive signal conductor planes.

In one form, the first patterned metallization of the first plane includes signal conductors and is formed at the substrate surface while the second patterned layer of the second plane includes reference voltage metallization pattern and is formed overlaying the first plane, separated therefrom by a layer of insulation, preferably polyimide.

In another form, the reference voltage plane is formed at the substrate surface and the signal conductor plane is formed overlaying the reference plane and separated therefrom by a layer of insulation, preferably polyimide.

FIGURES

An understanding of these and other objectives, advantages and features of this invention will be apparent from a reading of the following detailed description of the invention read in conjunction with the accompanying figures in which.

DETAILED DESCRIPTION

Figure 1:
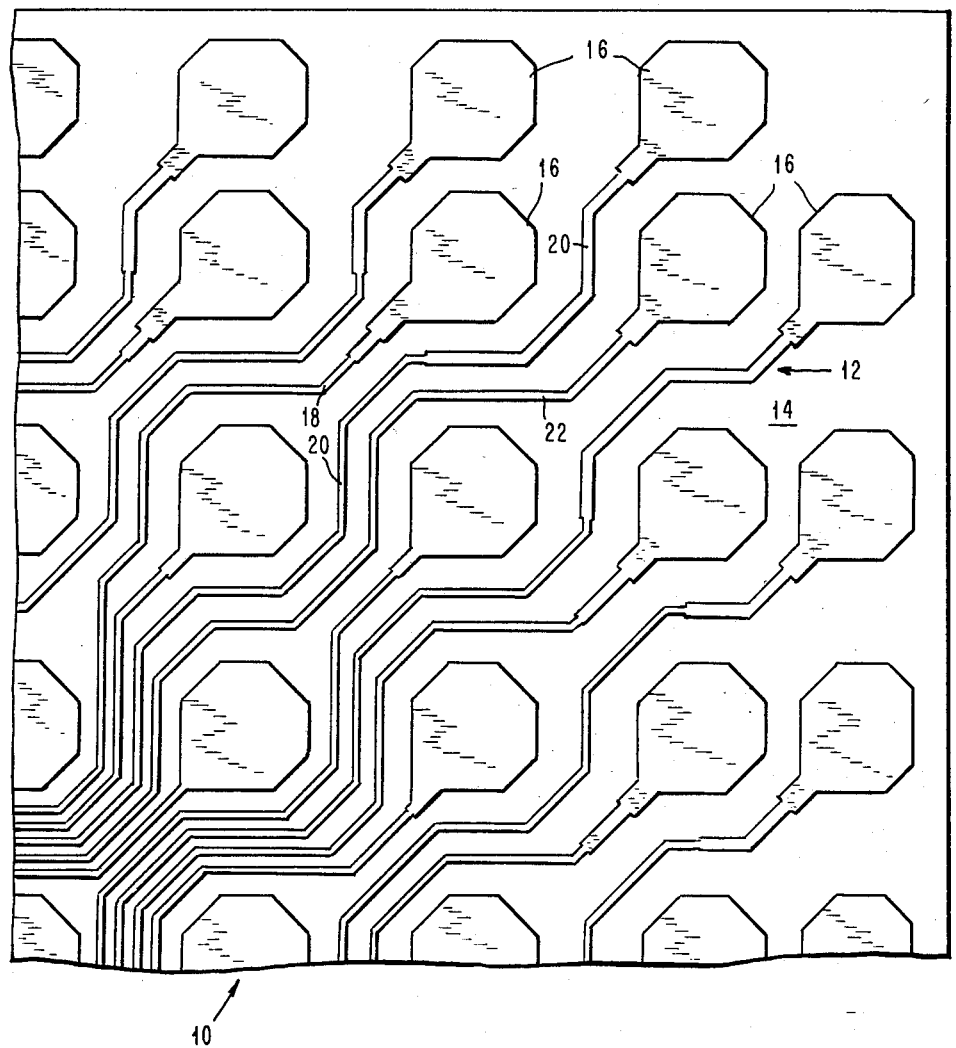
FIG. 1 is a view of substrate signal plane metallization of one form in accordance with this invention.

FIG. 1 shows a portion of a ceramic chip mounting substrate 10 having a first patterned layer 12 formed on the substrate surface 14. As formed, patterned layer 12 defines a first signal plane. Metallization layer 12 can be applied directly to substrate surface 14 and typically consists of chromium-copper-chromium multilayer film. The thickness of the multilayer film is typically between approximately 4 to 8 $\mu$m.

As seen in FIG. 1, metallization layer 12 includes a plurality of pads 16 which are provided to make contact to lead pins (not shown) arranged in the ceramic substrate body and extending therethrough for connecting the substrate to a larger circuit board. Continuing with reference to FIG. 1, layer 12 additionally includes a plurality of signal conductors, e.g. 18, 20, 22, for joining the lead pins to a chip (also not shown). The other conductors shown in FIG. 1 are also signal conductors but have not been numbered for the sake of simplicity. In this arrangement, substrate 10 includes holes therethrough corresponding to pads 16 into which the contact pins are inserted, so as to contact respective pads.

Figure 2:
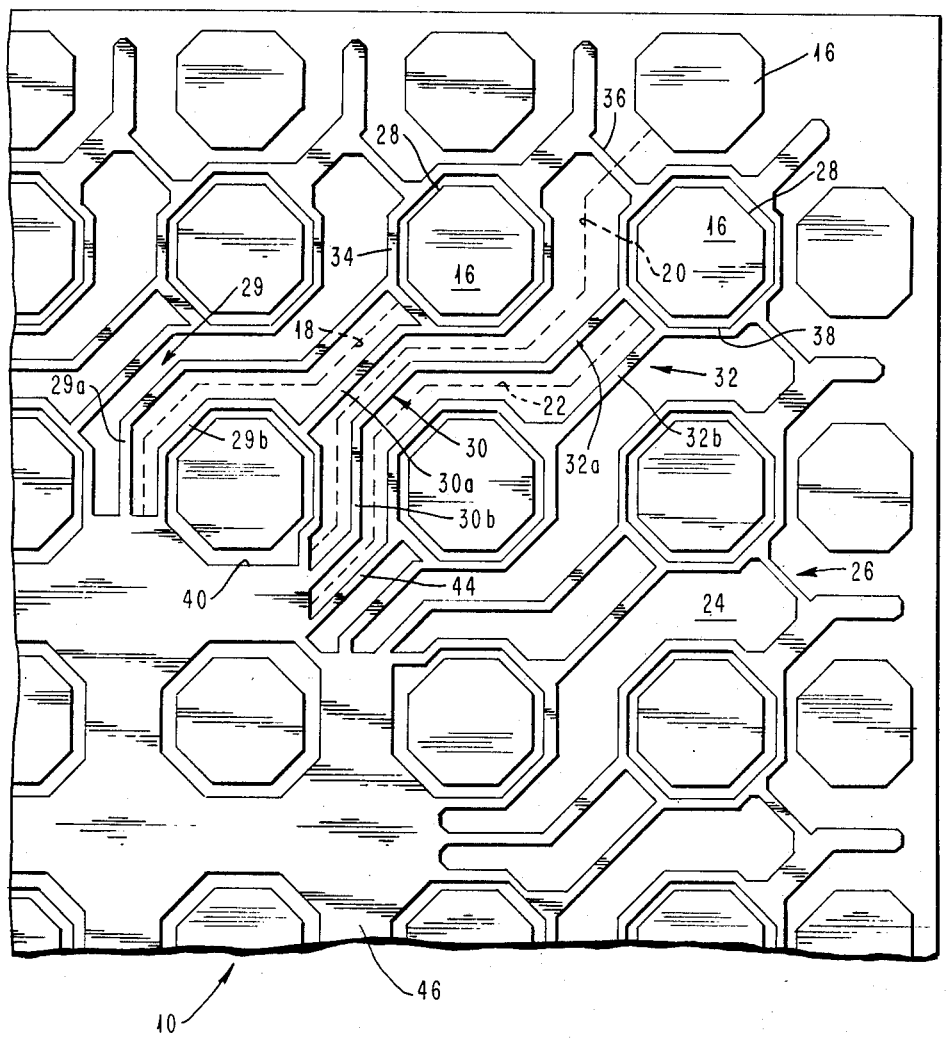
FIG. 2 is a view of a substrate reference plane patterned metallization of one form containing the shorted loop in accordance with this invention.

As seen in FIG. 2, a layer of insulating material 24 has been provided atop substrate surface 14 and metallization layer 12 and a second patterned metallization layer 26 provided atop insulating layer 24. In preferred form, insulating layer 24 may be a polyimide layer. Holes 28 are provided in insulating layer 24 so that portions of pads 16 in the first plane may be seen when the second metallization layer 26 is viewed in FIG. 2. The signal conductors connected to pads 16 are shown in dotted lines.

In accordance with this invention, in order to limit inductive coupling between the conductors of layer 12 and to also limit capacitive coupling between the conductors of layer 12 and the metallization of layer 26, the metallization pattern of layer 26 is provided with shorted conducting loops. Particularly, and as seen in FIG. 2, in order to reduce coupling between conductors, for example, 18, 20, 22 of layer 12, layer 26 includes shorted conductor loops 29, 30, 32. Loops 29, 30, 32 are formed and located such that they respectively follow the contours and path of the companion signal conductor. Particularly, loops 29, 30, 32 extend laterally of and on both sides of their respective signal conductors 18, 20, 22. The loops are joined, i.e. shorted, at their respective ends. More particularly, and as seen in FIG. 2, loops 29, 30, 32 each include branches 29a, b; 30a, b; and 32a, b which extend laterally and on either side of their respective signal conductor, for example, 18, 20, 22. As shown, the respective loops are joined with a branch of one loop also acting as a branch of another, e.g. branch 29b is the same as branch 30a, etc. Also seen in FIG. 2, the respective branches merge at their ends 34, 36, 38 and 40, 42, 44. In the case of ends 40, 42, 44, the branches merge at region 46 where metallization layer 26 is continuous. Layer 26 is continuous, i.e. blanket deposited where it is not configured to include this invention.

With this structure and in accordance with this invention, the cross talk between signal conductors is substantially avoided through the reduction of inductive coupling between the signal conductors. Furthermore, the capacitive coupling of the signal conductors and the reference voltage metallization is also reduced by the shorted loops. Particularly, the impedance of the signal conductors is increased owing to the reduction of the capacitive load on the signal conductors relative to the reference voltage plane.

Figure 3:
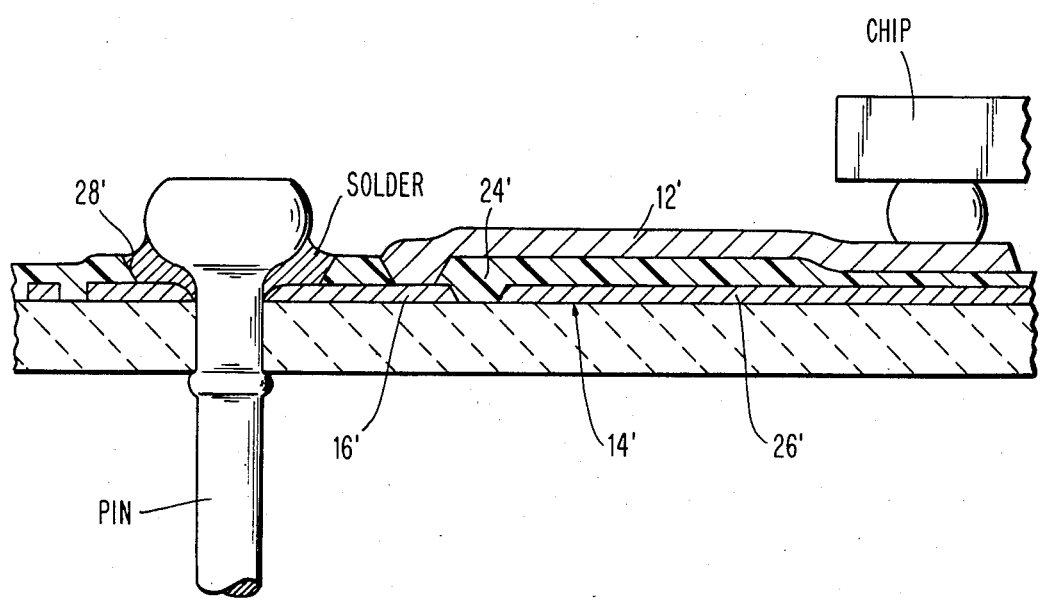
FIG. 3 is a cross sectional view of the substrate of a second form in accordance with this invention.

In another form of the substrate, shown in cross section in FIG. 3, where similar elements are designated with similar numbers primed, the reference voltage plane 26' is first deposited on the substrate and thereafter covered with the insulating layer 24', preferably polyimide. This assures a smooth surface for the second metallization plane 12' including the signal conductors which is thereafter deposited atop the insulation layer. In this arrangement, and as best seen in FIG. 3, contact pads 16' may be located in the first plane. Here, signal conductors in the second plane are lead to the contact pads which have a hole through their middle into which the contact pins are inserted. The pins are flattened at their head end in a manner known in the art and soldered to the pads as shown.

In addition to suppressing inductive and capacitive coupling of the conductors in the respective metallization planes, use of the laterally displaced loops provide manufacturing advantages. The advantages realized are in the form of increased manufacturing yield as compared with yield obtained for substrates made with solid, i.e. continuous, reference voltage planes. More particularly, during manufacturing of the substrates, openings are etched in polyimide insulating layer 24 which separates the two conductive layers, i.e. 12 and 26. Dust particles on the mask used for etching openings 28 can cause undesired holes to also be etched into insulating layer 24. As a result, when the second metallization layer is deposited, connections between the first and second metallization may result with the effect of creating a short circuit between the two layers. A solid reference voltage plane, therefore, is susceptible, to short circuits which may arise from the defects in insulating layer 24.

In accordance with this invention, because the reference plane metallization is in the form of loops laterally displaced from the signal conductors, short circuits cannot arise where there is a defect in the insulating layer. Since the metallization of the reference plane is laterally displaced from the metallization of the signal conductor plane metal which is deposited in the unwanted hole does not contact the respective loop. This assumes the defect hole is small as is the case where dust causes the defect. As a result of this advantage, it has been found desirable to incorporate the looped reference plane in all structures where the distance between individual signal conductors will permit the shorted loops to be arranged in conformity with the signal conductors.

Finally, it will be appreciated by those skilled in the art that this invention can be used where multiple reference planes and signal planes are proposed. Particularly, where multiple reference planes and signal planes are proposed, the invention can be used if the signal planes are separated by reference planes and insulating layers. Particularly, successive alternating cells of reference plane insulator and signal plane may be used to build a structure of any desired thickness wherein the advantages of the invention above described are included.

While the details of this invention have been described in connection with the preferred embodiment, it will be appreciated by those skilled in the art that modifications, changes and adjustments may be made in the details of this invention without departing from its spirit.

What we claim is:

1. A ceramic substrate for mounting integrated circuit semiconductor devices, the substrate having holes therethrough with lead pins mounted therein and having at least two patterned metallization layers, wherein increased density is achieved while eliminating capacitive and inductive coupling comprising:

a first metallization layer on the top surface of said substrate including a plurality of closely spaced pads provided to make contact to I/O pads on said device mounted on said substrate and a plurality of signal conductors connected to and emanating from said closely spaced pads and connected to said lead pins mounted on said substrate;

a second shielding metallization layer on the top surface of said substrate comprised of a plurality of electrically interconnected first loops said first loops including metal stripe portions located laterally of said signal conductors of said first metallization layer and in conforming relationship and second interconnected loops disposed about and in spaced relation to said lead pins and a layer of insulating material disposed between said first and second metallization layers.

2. A substrate, as in claim 1, wherein the insulating material is polyimide.

3. A substrate, as in claim 1, wherein the first metallization layer is formed at the substrate surface.

4. A substrate, as in claim 1, wherein the second metallization layer is formed at the substrate surface.

* * * * *